United States Patent [19]
Karaki

[11] Patent Number: 5,475,518
[45] Date of Patent: Dec. 12, 1995

[54] APPARATUS FOR OPTICALLY TRANSMITTING DATA

[75] Inventor: Koichi Karaki, Hino, Japan

[73] Assignee: Olympus Optical Co., Ltd., Tokyo, Japan

[21] Appl. No.: 191,580

[22] Filed: Feb. 4, 1994

Related U.S. Application Data

[63] Continuation-in-part of Ser. No. 881,192, May 11, 1992.

[30] Foreign Application Priority Data

| May 10, 1991 | [JP] | Japan | 3-133285 |
| Jul. 29, 1991 | [JP] | Japan | 3-210437 |
| May 6, 1992 | [JP] | Japan | 4-113689 |

[51] Int. Cl.$^6$ .................................................. H04B 10/00
[52] U.S. Cl. .......................... 359/154; 359/173; 369/117; 369/121
[58] Field of Search .................................. 359/154, 157, 359/164, 167, 168, 173, 126; 365/119, 215, 216; 369/106, 109, 112, 117, 118, 120, 121, 116

[56] References Cited

U.S. PATENT DOCUMENTS

| 4,101,976 | 7/1978 | Castro et al. | 365/119 |
| 5,255,218 | 10/1993 | Yagyu et al. | 365/119 |

OTHER PUBLICATIONS

Mitsunaga, Spectrally programmed stimulated photon echo, *Optical Letters* vol. 16 No. 4 Feb. 15, 1981.
W. E. Moerner; *Persistent Spectral Hole–Burning: Science and Applications;* pp. 251–307, 1988.
W. E. Moerner, "Persistent Spectral Hole Burning: Science and Applications", Topics in Current Physics, vol. 44, pp. 1–15 and 250–307.

Primary Examiner—Leo H. Boudreau
Assistant Examiner—Rafael Bacares
Attorney, Agent, or Firm—Stevens, Davis, Miller & Mosher

[57] ABSTRACT

An optical data transmission apparatus includes a hole-burning effect element for recording data. Upon transmitting input serial data in a multiplex mode along a single optical fiber, the input serial data are stored in the hole-burning effect element having an inhomogeneous broadening on the light absorption spectrum, and then light transmitted through the hole-burning effect element is transmitted over the optical fiber. At the receiver end, the laser light is divided into a plurality of portions having different wavelengths and these portions are made incident upon a light receiving element array. Alternatively, a reading light pulse is made incident upon the element to generate a single light pulse having the spectrum distribution corresponding to the serial data on the frequency domain, and the light pulse is transmitted to the receiver end to duplicate the light absorption spectrum on a receiver end hole-burning effect element which is irradiated by a reading light pulse to generate light pulses corresponding to the duplicated light absorption spectrum, and these light pulses are successively made incident upon a photodetector to reproduce the input serial data.

32 Claims, 11 Drawing Sheets

FIG_1A
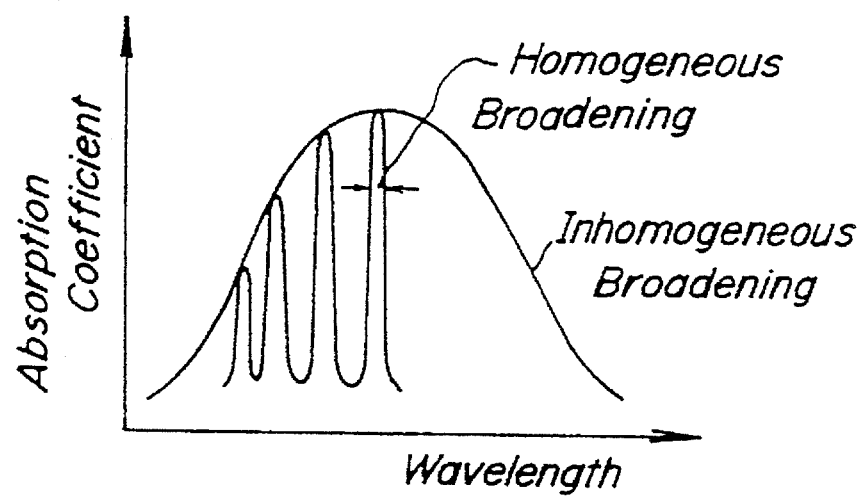
FIG_1B
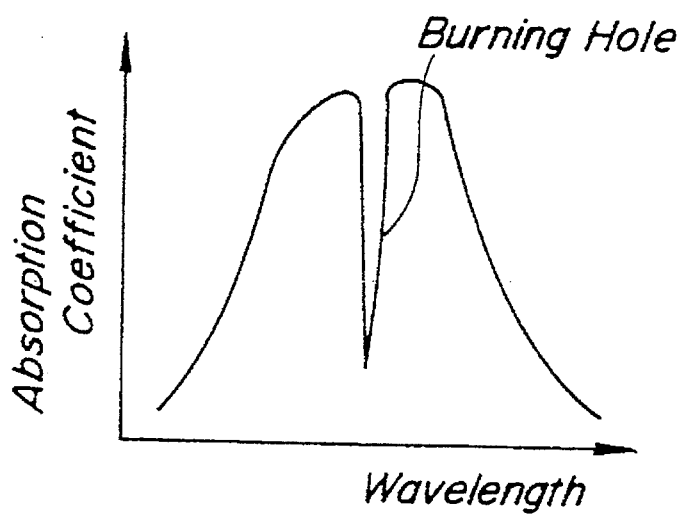

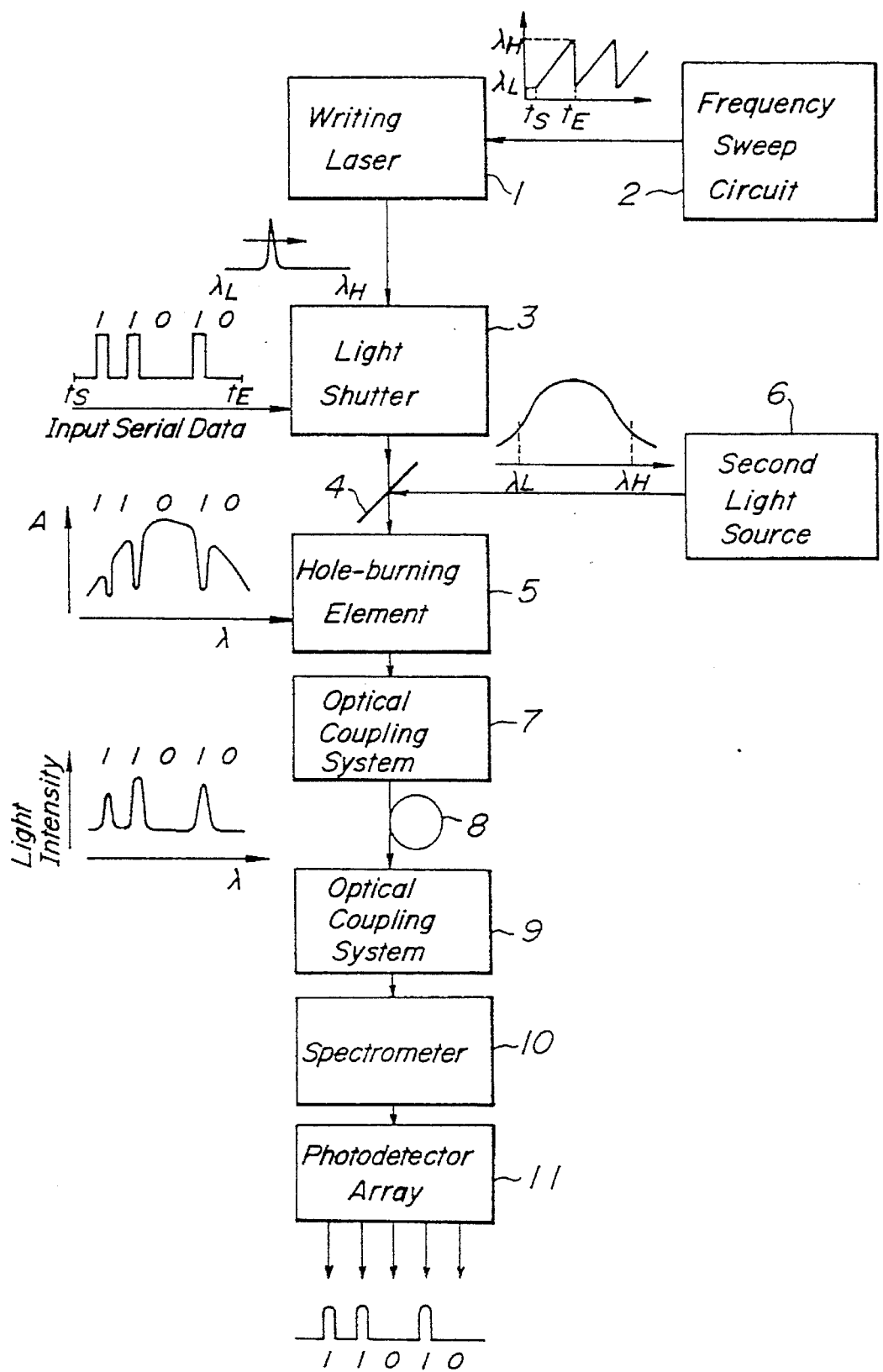

FIG_3A
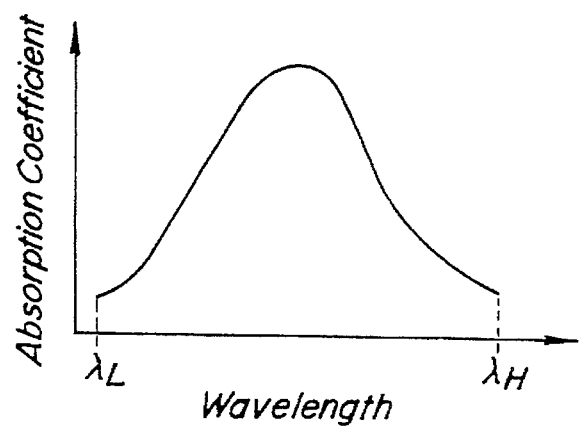
FIG_3B
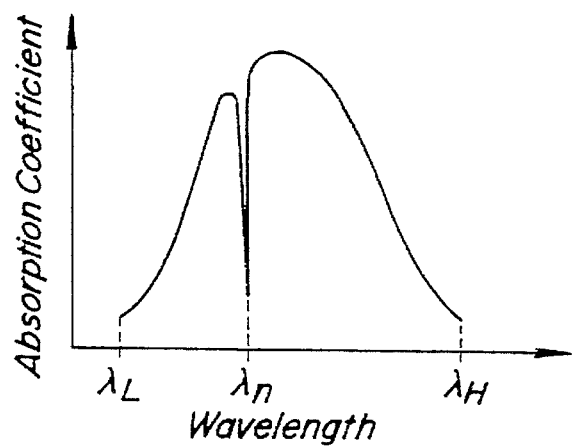
FIG_3C
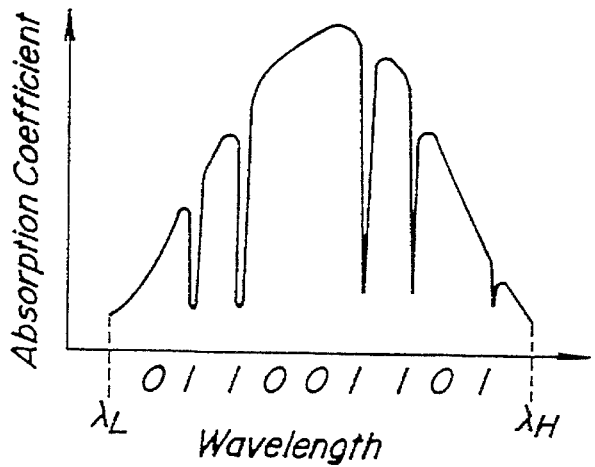

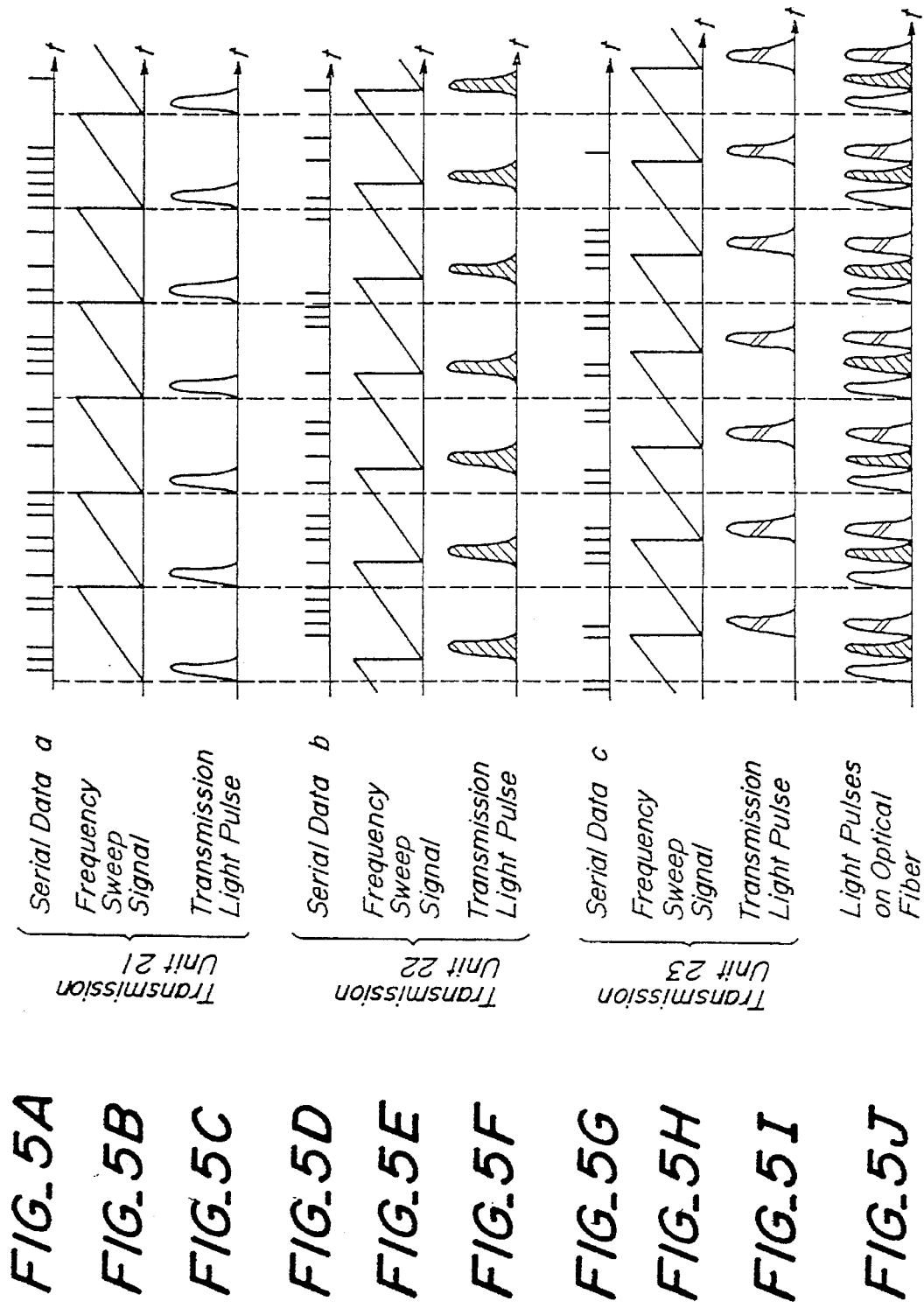

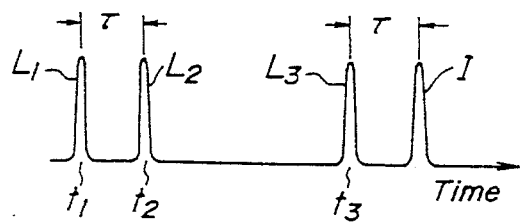
FIG_6A
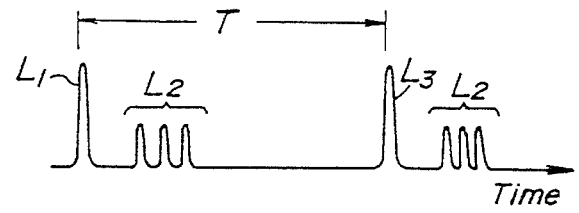
FIG_6B
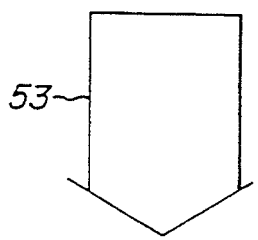
FIG_7
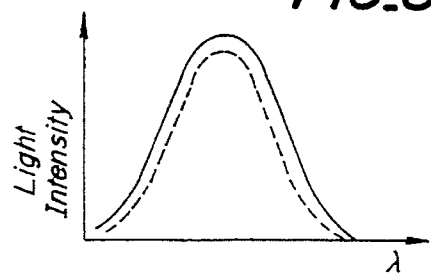
FIG_8A
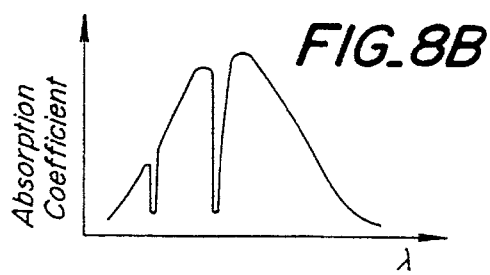
FIG_8B
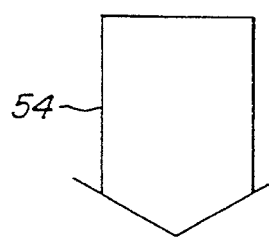
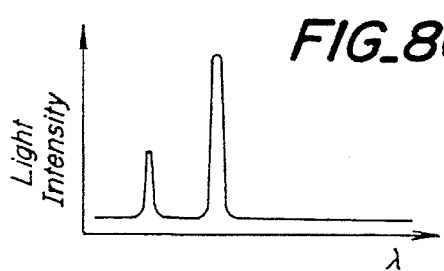
FIG_8C
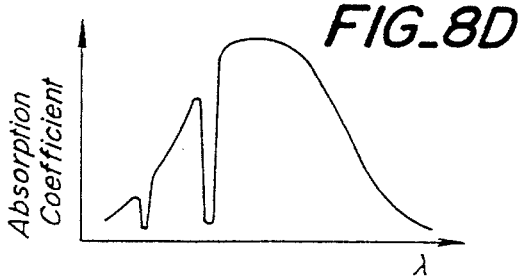
FIG_8D

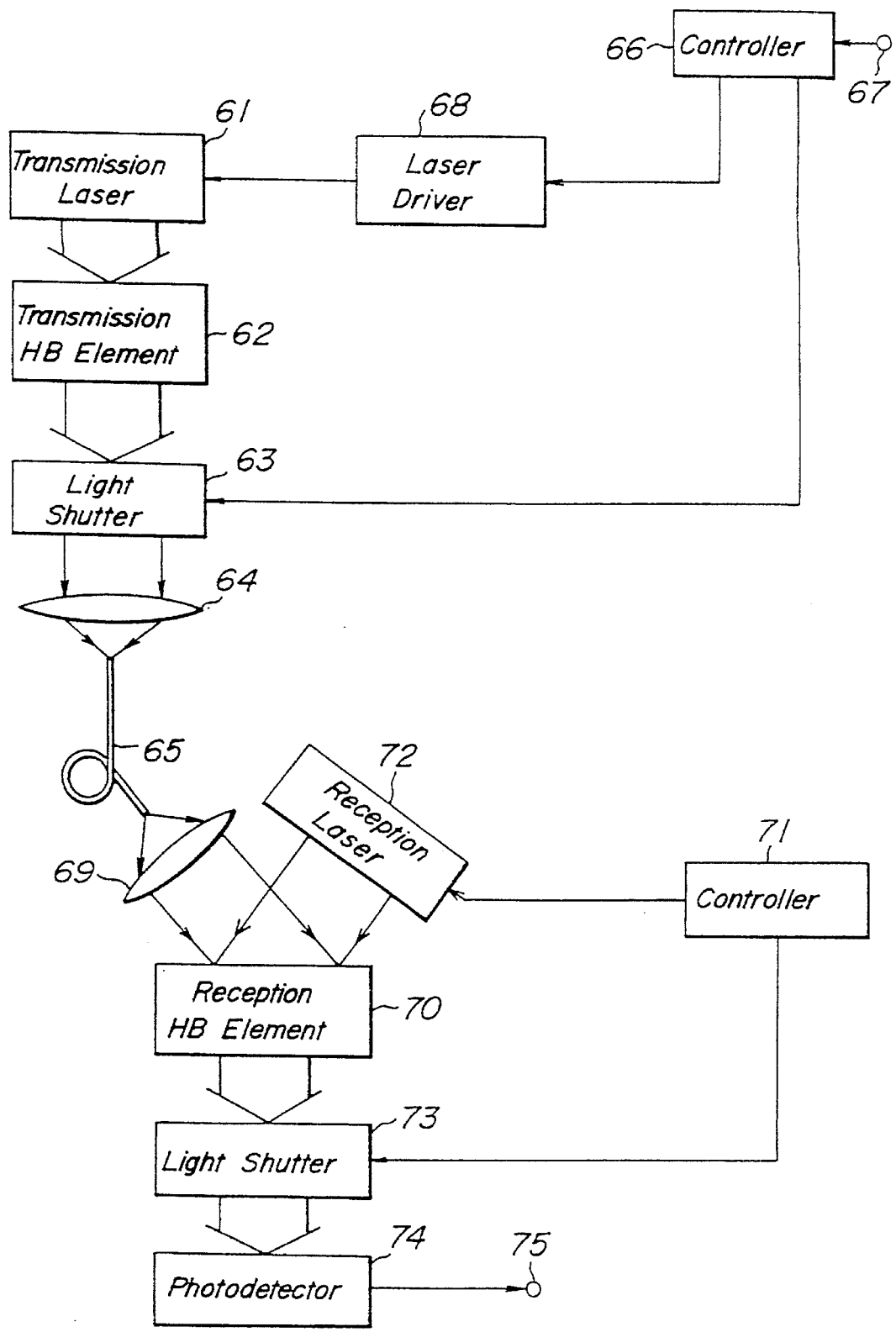

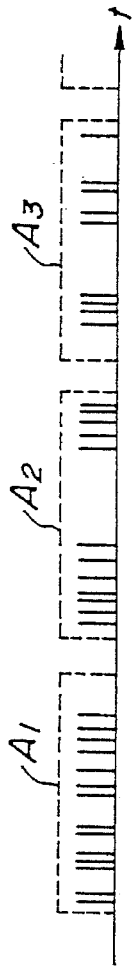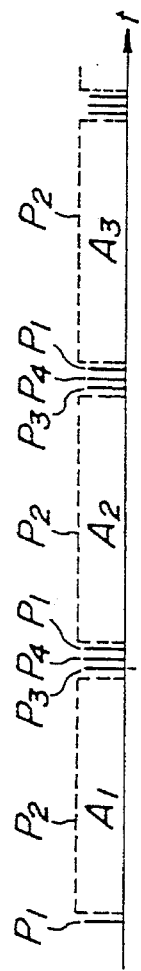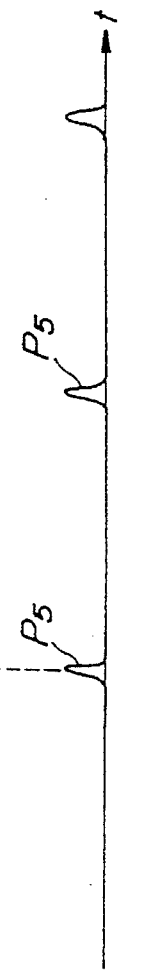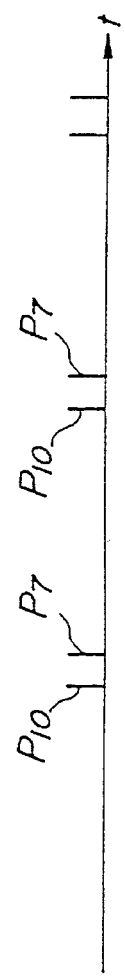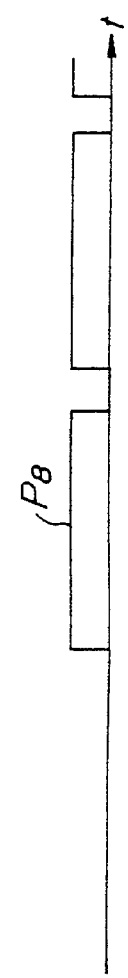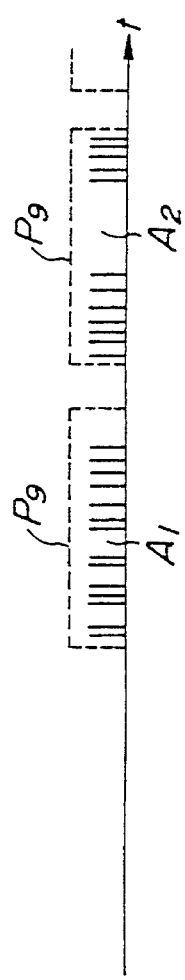
FIG_10A  FIG_10B  FIG_10C  FIG_10D  FIG_10E  FIG_10F  FIG_10G

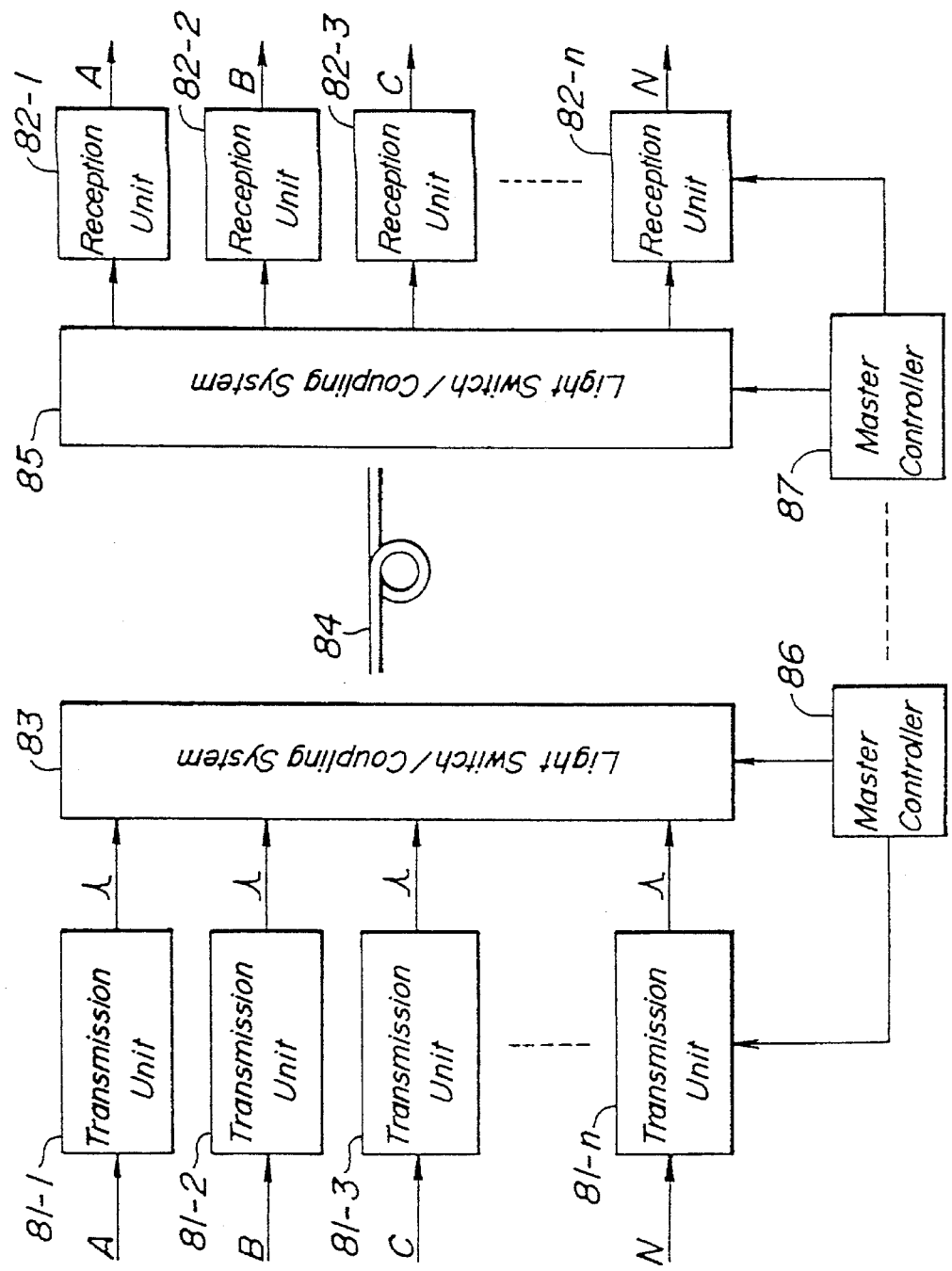
FIG_11

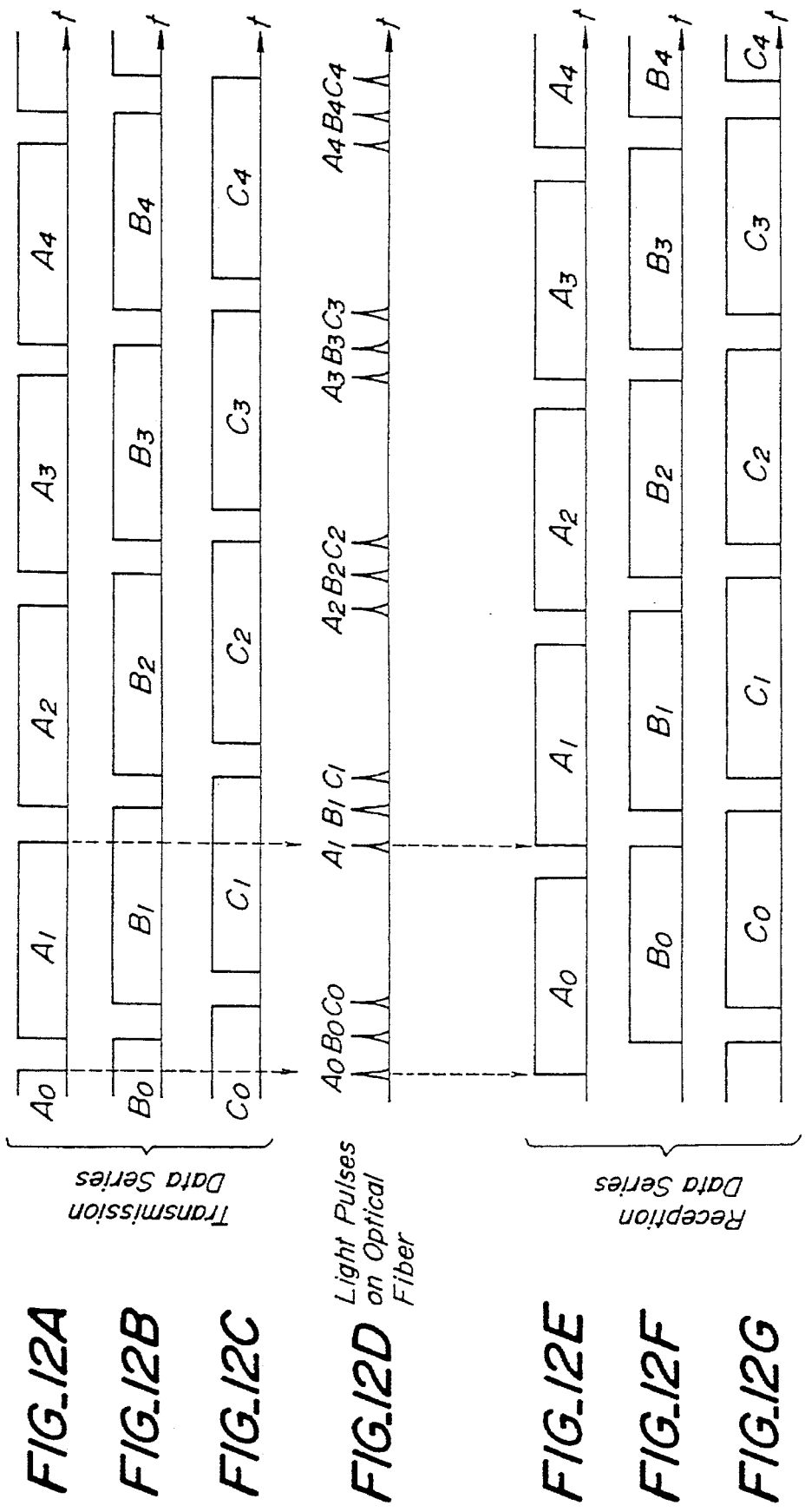

FIG_13
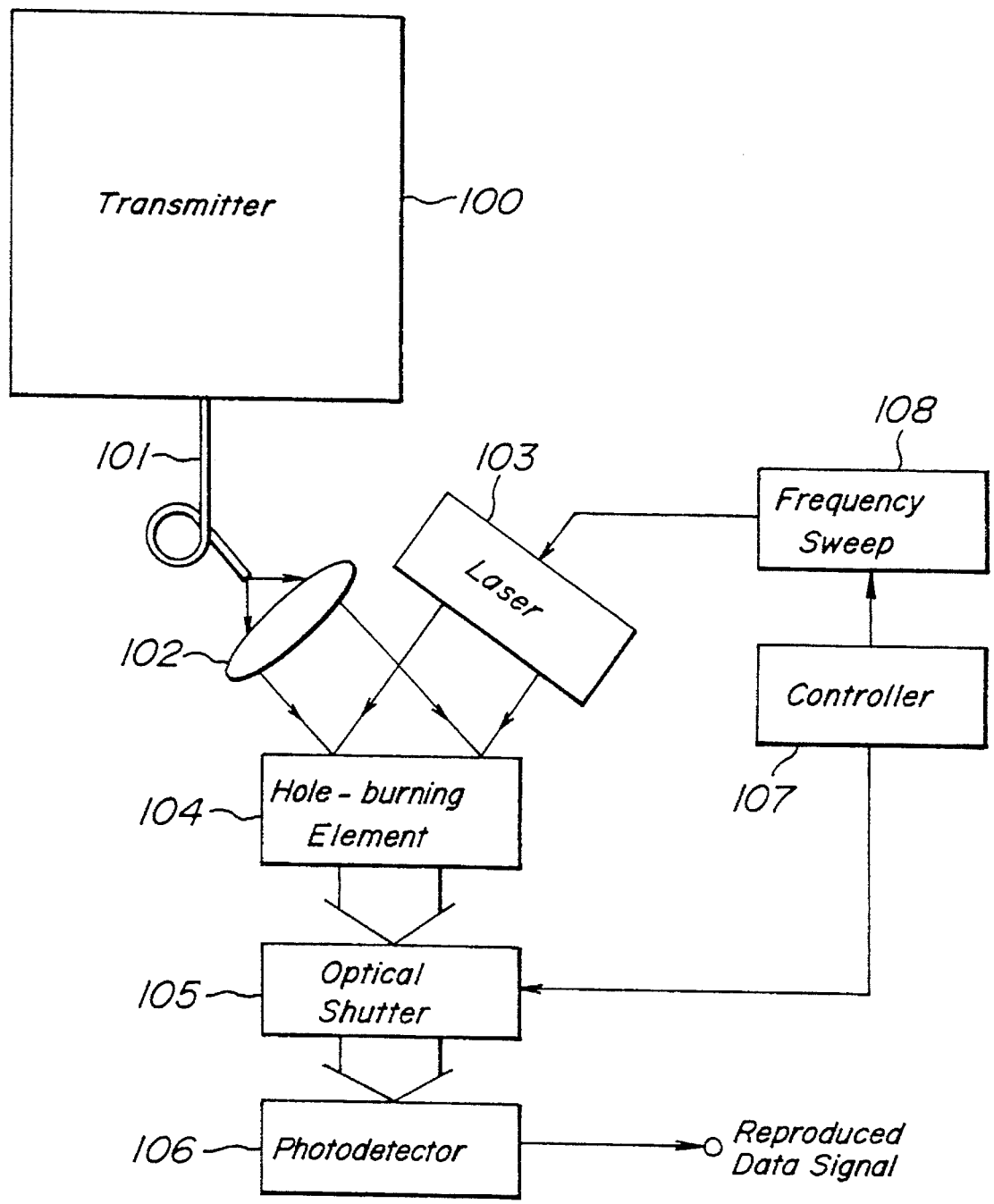

APPARATUS FOR OPTICALLY TRANSMITTING DATA

This is a continuation-in-part application of the co-pending application Ser. No. 07/881,192 filed May 11, 1992.

BACKGROUND OF THE INVENTION

1. Field of the Invention

The present invention relates to an apparatus for optically transmitting serial data in a multiplex mode through an optical transmission path such as optical fiber, optical waveguide and free space by utilizing a hole-burning effect.

2. Related Art Statement

In a known optical communication system, an amplitude of light, i.e. an intensity of light is modulated in accordance with data to be transmitted and the light having the thus modulated intensity is transmitted through an optical transmission path. In this case, in the optical transmission path such as an optical fiber, binary signals are serially transmitted in a time domain. Since a laser diode serving as a transmission light source has a superior modulation property, the laser light has a very high vibrating frequency and the transmission path has a low dispersion, it is possible to attain a high transmission speed up to several giga bits per second.

Nowadays an amount of data to be transmitted has been increased largely and it has been desired to increase the data transmission capacity by affecting the multiplex data transmission without increasing the number of optical fibers. As the optical multiplex data transmission system, a wavelength multiplex data transmission system has been proposed. In this known wavelength multiplex data transmission system, the transmission data is multiplexed in a frequency domain. That is to say, there are provided a plurality of laser light sources which emit laser light beams having different wavelengths and an intensity of each of these laser light beams is modulated by a respective one of a plurality of transmission data signals. These modulated light beams are simultaneously transmitted through one and the same optical fiber. Usually, two to four wavelengths are selected from 0.81 µm, 0.85 µm, 0.89 µm, 1.2 µm, 1.3 µm and 1.55 µm.

In such a known wavelength multiplex transmission system, a multiplexing factor amounts to at most 5, so that a multiplex transmission efficiency is low. For instance, in case of applying the transmission system to the computer data processing, it is desired to transmit at once information data of one byte (8 bits) or more. Moreover, the processing speed and data transmission capacity of the computer system have become increased, so that it is required to develop a novel transmission system in which several tens to one hundred channel data can be transmitted simultaneously. Such a requirement will meet a data transmission in a future high speed parallel processing computer.

In a field of a data communication system which links computers with each other, in case of performing data links between computers and between a computer and a plurality of terminal devices, it is necessary to utilize a single transmission path at a high transmission efficiency. In order not to decrease the data transmission speed, there has been proposed a packet transmission system using the time division method. In the known packet transmission system, an electrically operating multiplexer-demultiplexer is used, so that if the packet transmission system is applied to the optical data transmission system, it will be necessary to convert the light signal into an electrical signal. Then, the whole system is liable to be complicated in construction and expensive in cost.

SUMMARY OF THE INVENTION

The present invention has for its object to provide a novel and useful apparatus for optically transmitting data, in which the above mentioned demerits of the known transmission systems can be removed and a large number of serial data can be transmitted simultaneously through a single optical transmission path, so that a very high data transmission capacity can be attained.

It is another object of the invention to provide an apparatus for optically transmitting data, in which a plurality of data can be multiplexed purely in an optical manner, and thus the electrical multiplexer-demultiplexer can be dispensed with.

According to the invention an apparatus for optically transmitting data comprises:

a hole-burning material having an inhomogeneous width and a homogeneous width in an optical absorption line for recording said data to be transmitted, the inhomogeneous width being greater than the homogeneous width;

a first light source having a frequency width narrower than the inhomogeneous width for projecting a first light beam on the hole-burning material;

control means for controlling a wavelength of the first light beam from the first light source in accordance with said data to be transmitted;

a second light source having a frequency width wider than the homogeneous width for projecting a second light beam on the hole-burning material; and optical means for guiding the second light beam from the second light source through the hole-burning material from the second light source to a transmission path;

wherein the first light beam having a wavelength corresponding to said data to be transmitted is projected on the hole-burning material from the first light source, and then the second light beam from the second light source is projected on the hole-burning material for transmitting maid data.

In a preferable embodiment of the apparatus according to the invention, said control means comprises frequency sweeping means for sweeping frequencies of the first light beam from the first light source, and an optical shutter located between the first light source and the hole-burning material for controlling projection of the first light beam from the first light source in accordance with said data to be transmitted.

According to further aspect of the present invention, an apparatus for optically transmitting data comprises:
(a) a plurality of transmission units, each of said transmission units comprising,
a hole-burning material having an inhomogeneous width and a homogeneous width in an optical absorption line for recording said data to be transmitted, the inhomogeneous width being greater than the homogeneous width;
a first light source having a frequency width narrower than the inhomogeneous width for projecting a first light beam on the hole-burning material;
control means for controlling a wavelength of the first light beam from the first light source in accordance with said data to be transmitted;
a second light source having a frequency width wider than the homogeneous width for projecting a second light beam on the hole-burning material; and optical means for guiding the second light beam from the second light source through the hole-burning material from the second light source to a transmission path;

wherein the first light beam having a wavelength corresponding to said data to be transmitted is projected on the hole-burning material from the first light source, and then the second light beam from the second light source is projected on the hole-burning material for transmitting said data; and (b) means for controlling the plurality of transmission units such that the second light beams from the plurality of transmission units are guided to the transmission path in a time sequential manner.

According to further aspect of the invention, an apparatus for optically transmitting and/or receiving data comprises:

a hole-burning material having an inhomogeneous width and a homogeneous width in an optical absorption line for recording said data to be transmitted, the inhomogeneous width being greater than the homogeneous width;

a first light source having a frequency width narrower than the inhomogeneous width for projecting a first light beam on the hole-burning material;

control means for controlling a wavelength of the first light beam from the first light source in accordance with said data to be transmitted;

a second light source having a frequency width wider than the homogeneous width for projecting a second light beam on the hole-burning materia; and optical means for guiding the second light beam from the second light source through the hole-burning material from the second light source to a transmission path, in which the first light beam having a wavelength corresponding to said data to be transmitted is projected on the hole-burning material from the first light source, and then the second light beam from the second light source is projected on the hole-burning material for transmitting said data;

light dispersing means for dispersing the second light beam through the transmission path; and photoelectric transfer means for receiving the second light beam from the light dispersing means and for transducing the second light beam into an electric signal.

In a preferable embodiment of the optical data transmitting and/or receiving apparatus according to the invention, at a transmitter end, a first light pulse having a narrow spectrum width is projected on a transmitter end hole-burning material having an inhomogeneous broadening in a light absorption spectrum in accordance with input serial data to be transmitted within a frequency range to record an absorption spectrum having holes corresponding to the input serial data by the hole-burning effect, then a second light pulse having a broad spectrum corresponding to the frequency range of the transmitter end hole-burning material to derive a single light pulse having a spectrum which corresponds to the absorption spectrum recorded in the transmitter end hole-burning material, land then this single light pulse is transmitted to a receiver end via the transmission path, and at the receiver end, the transmitted single light pulse is projected on the receiver end hole-burning material having the same property as that of the transmitter end hole-burning material to duplicate the absorption spectrum recorded on the transmitter end hole-burning material, and then the receiver end hole-burning material is irradiated with a light flux whose spectrum width is narrower than that of the second light beam and whose frequency is swept over a frequency range over which the data has been recorded to reproduce the duplicated data in a serial manner.

According to further aspect of the invention, an apparatus for optically transmitting data comprises:

a hole-burning material having an inhomogeneous width and a homogeneous width in an optical absorption line for recording said data to be transmitted, the inhomogeneous width being greater than the homogeneous width;

a light source having a frequency width narrower than the inhomogeneous width for projecting light pulses on the hole-burning material;

control means for controlling the light source such that the light source sequentially radiates a recording pulse for beginning a recording of said data to be transmitted on the hole-burning material, a pulse corresponding to said data, and a transmitting pulse for transmitting said data; and optical means for guiding the light pulses through the hole-burning material from the light source to a transmission path.

According to further aspect of the invention, an apparatus for optically transmitting and/or receiving data comprises:

a first hole-burning material having a first inhomogeneous width and a first homogeneous width in the optical absorption line for recording said data to be transmitted, the first inhomogeneous width being broader than the first homogeneous width;

a first light source having a frequency width narrower than the first inhomogeneous width for projecting a light beam on the hole-burning material;

control means for controlling the first light source such that the light source sequentially radiates a recording pulse for beginning a recording of the data to be transmitted on the hole-burning material, a pulse corresponding to said data, and a transmitting pulse for transmitting said data, said pulses being components of the light beam;

first optical means for guiding the light beam through the first hole-burning material from the first light source to a transmission path;

a second hole-burning material having a second inhomogeneous width and a second homogeneous width in the optical absorption line for recording said data transmitted through the transmission path, the second inhomogeneous width being broader than the second homogeneous width;

a second light source having a frequency width broader than the homogeneous width for projecting reception light pulses on the second hole-burning material for reading said data;

photoelectric transfer means for receiving the reception light pulse through the second hole-burning material from the second light source and for transducing the reception light pulses into an electrical signal; and second optical means for guiding the reception light pulses from the second hole-burning material to the photoelectric transfer means, wherein said data are transmitted to the second hole-burning material by the transmitting pulse, and then the second light source radiates a reading pulse, which is one of said reception light pulses for reading said data.

The present invention also has for its object to provide a novel and useful apparatus for receiving data transmitted optically.

According to the invention, an apparatus for receiving data transmitted-optically through a transmission path comprises:

a hole-burning material having an inhomogeneous width and a homogeneous width in an optical absorption line for recording said data transmitted through a transmission path, the inhomogeneous width being greater than the homogeneous width;

a light source having a frequency width narrower than the inhomogeneous width for projecting a light beam on the hole-burning material;

frequency sweeping means for sweeping frequencies of the light beam from the light source over a frequency region where said data are recorded; and photoelectric transfer means for receiving the light beam through the hole-burning material from the light source and for transducing the light beam into an electric signal.

BRIEF DESCRIPTION OF THE DRAWINGS

FIGS. 1A and 1B are graphs for explaining the hole-burning effect;

FIG. 2 is a block diagram illustrating an embodiment of the optical data transmitting apparatus according to the invention;

FIGS. 3A to 3C are graphs for explaining the operational principle of the hole-burning element;

FIGS. 5A to 5J are signal waveforms for explaining the operation of the apparatus shown in FIG. 4;

FIGS. 6A and 6B are signal waveforms for explaining the principle of the photon echo effect;

FIG. 7 is a schematic view illustrating the basic construction for performing the duplication of the hole-burning;

FIGS. 8A to 8D are graphs for explaining the operation of the duplication of the hole-burning;

FIG. 9 is a block diagram showing another embodiment of the optical data transmitting apparatus according to the invention;

FIGS. 10A to 10G are signal waveforms for explaining the operation of the apparatus illustrated in FIG. 9;

FIG. 11 is a block diagram showing another embodiment of the optical data transmitting apparatus according to the invention;

FIGS. 12A to 12G are signal waveforms for explaining the operation of the apparatus shown in FIG. 11; and FIG. 13 is a block diagram illustrating another embodiment of the optical data transmitting apparatus according to the invention.

DETAILED EXPLANATION OF THE PREFERRED EMBODIMENTS

Figure 4:
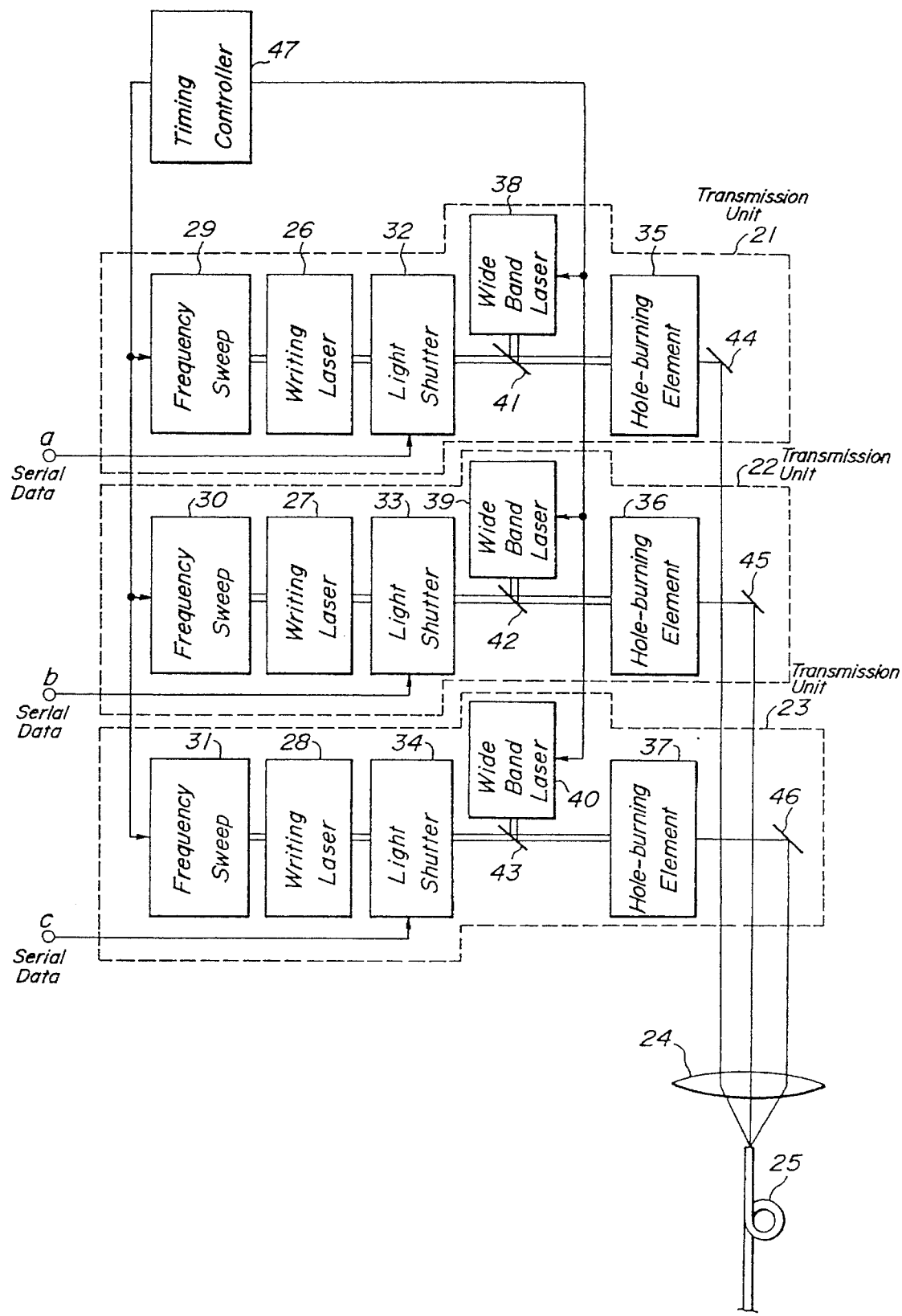
FIG. 4 is a block diagram depicting another embodiment of the optical data transmitting apparatus according to the invention.

According to the invention, a hole-burning effect element is made of material having an inhomogeneous broadening on the light absorption spectrum. Such a material has been known and is disclosed in U.S. Patent Specification No. 4,101,976. In this U.S. Patent Specification, the hole-burning effect element is not used as a data transmitting element, but is used as a memory element. In the present invention, the serial data is transmitted in a multiplex mode by utilizing the element made of the material having the hole-burning effect. First of all, the hole-burning effect will be explained.

As shown in FIG. 1A, the hole-burning effect element shows a light absorption spectrum having an inhomogeneous broadening wider than homogeneous broadenings. When light having a spectrum broadening which is narrower than the inhomogeneous broadening is made incident upon such a hole-burning effect element, a light absorption is saturated and a burning hole is formed in the light absorption spectrum as illustrated in FIG. 1B, said burning hole having a spectrum corresponding to the frequency broadening of the laser beam or the homogeneous broadening of the material. When such a hole is persistent even after the irradiation of the laser light beam is stopped, this phenomenon is called persistent hole-burning (PHB). In the above mentioned U.S. Patent Specification No. 4,101,976, the wavelength $\lambda$ of the laser light beam is scanned and its intensity is modulated in accordance with the data to store the data in the hole-burning effect element. That is to say, in this U.S. Patent, the hole-burning effect element is utilized as a memory element. According to the invention, such a hole-burning effect element is used as a transmission element for performing the data multiplex on the wavelength domain, and a multiplexing factor is given by a ratio of (inhomogeneous broadening)/(homogeneous broadening) and usually amounts to an order of 1000.

FIG. 2 is a block diagram showing an embodiment of the optical data transmitting apparatus according to the invention. In this embodiment, a hole-burning element is provided only in a transmitter end to convert input serial data into parallel data and parallel data is transmitted through a single optical fiber in a multiplex mode. At a receiver end, the light transmitted from the transmitter end via the optical fiber is divided spectroscopically into light signals having different frequencies to reproduce the original serial data.

For simplicity, in this embodiment, the input serial data is formed by five bit serial data as illustrated in FIG. 2 and is formed by electric pulses. At the transmitter end, the electric serial data pulses are converted into a parallel data light pulse multiplexed in the frequency domain, and the thus converted light pulse is parallelly transmitted. At the transmitter end, there are provided writing laser 1 and a frequency sweep circuit 2 for sweeping a wavelength of a laser light beam emitted from the writing laser. That is to say, within a predetermined time period $T=t_s-t_E$, the wavelength of the laser light is changed from $\lambda_L$ to $\lambda_H$ to produce a single mode first light pulse having a narrow spectrum. The first light pulse is made incident upon a light shutter 3.

To the light shutter 3 is supplied the input serial data signal and the shutter is opened or closed in accordance with the data signal. That is to say, when the input data signal is of a logic level "1", the shutter 3 is opened, but when the input data signal is of a logic level "0", the shutter is closed. In this manner, the first light pulse emitted from the writing laser 1 is made incident via a half-mirror 4 upon a hole-burning effect element 5. Then, the light absorption spectrum of the hole-burning effect element 5 is changed in accordance with the input serial digital data signal.

Now the principal operation of the hole-burning effect element will be explained with reference to FIG. 3.

As depicted in FIG. 3A, when the first light pulse having a narrow spectrum is made incident upon the hole-burning effect element made of a solid medium having gas or organic pigment doped therein and possessing a wide inhomogeneous broadening of the light absorption spectrum extending from $\lambda_L$ to $\lambda_H$, a light absorption coefficient is greatly decreased at a portion corresponding to a wavelength $\lambda_n$ of the first light pulse as illustrated in FIG. 3B. In this manner, there is formed a hole or serration in the light absorption spectrum. Therefore, when the wavelength $\lambda_n$ of the first light pulse is scanned within the light absorption spectrum of the solid medium and at the same time the shutter 3 is operated in accordance with the input serial data signal in synchronism with the scanning of the wavelength, it is possible to write the plural bit data in the light absorption spectrum of the hole-burning effect element 5 as depicted in FIG. 3C. In FIGS. 2 and 3C, there are shown five and nine bit data respectively for the sake of simplicity, but the number of the bits is given by the ratio of (inhomogeneous broadening width)/(homogeneous broadening width) and may amount to an order of 1000.

The data has been written in the hole-burning effect element in the frequency domain, so that when a second light pulse having a spectrum width which covers the wavelength range from $\lambda_L$ to $\lambda_H$ is transmitted through the hole-burning effect element 5, there is obtained a single light pulse which bears the data signals parallelly. This single light pulse is transmitted from the transmitter end to the receiver end by means of the optical transmission path such as an optical fiber. In this manner, in the present embodiment, one or more holes are formed in the light absorption spectrum of the hole-burning effect element 5 in accordance with the input serial data signals, and then the second light pulse is made incident upon the hole-burning effect element. Then, the second light pulse through the hole-burning effect element has the intensity spectrum corresponding to the hole or holes in the light absorption spectrum of the hole-burning effect element. This second light bearing the input serial data is transmitted to the receiver end via the optical transmission path. In this manner, according to the invention, the capacity of data which can be transmitted simultaneously in the multiplex mode can be increased materially.

As illustrated in FIG. 2, a second light pulse emitted from a second light source such as a transmission laser and laser diode and having a spectrum width which covers the wavelength range from $\lambda_L$ to $\lambda_H$ is made incident via the half-mirror 4 upon the hole-burning effect element 5 to derive a data bearing light pulse which bears the input serial data of five bits in the frequency domain. It should be noted that in this example, five bits constitute one word. The light pulse bearing thus derived data is made incident via a optical coupling system 7 having a lens upon an incident end of an optical fiber 8.

The data bearing light pulse transmitted through the optical fiber 8 is made incident via an optical coupling system 9 upon a spectrometer 10 such as a grating. Then the light pulse is divided spectroscopically into a plurality of light beams having different wavelengths and these light beams are made incident upon a light receiving element array 11. Then, the light receiving element array 11 generates electrical data signals of one word which correspond to the original input serial data of 5 bits. In this manner, the serial data of one word can be transmitted parallelly. By repeating the above mentioned process, it is possible to transmit successive input data parallelly through the single optical transmission path 8.

As explained above, in the present embodiment, by writing the input serial data to be transmitted in the frequency domain of the light absorption spectrum of the hole-burning effect element 5, and then by transmitting the second light pulse having the spectrum width which covers the frequency range of the hole-burning effect element through the hole-burning effect element, it is possible to transmit the input serial data in a multiplex mode. In this case, the multiplex factor is given by the ratio of the homogeneous broadening width to the inhomogeneous broadening width, and therefore the data transmission capacity can be increased very largely.

FIG. 13 is a schematic view showing an embodiment of the apparatus for optically transmitting data according to the invention, in which a hole-burning effect element is also provided in the receiver end. Prior to explaining this embodiment, the duplication of the hole-burning spectrum with the aid of the light will be explained.

As depicted in FIG. 7, first and second medium 51 and 52 having the inhomogeneous broadening on the light absorption spectrum are arranged in succession. The first medium 51 is irradiated with light 53, in which holes on the light absorption spectrum have been written by any means as shown in FIG. 8B. The first and second medium 51 and 52 are made of the same material and no hole is formed on the light absorption spectrum of the second medium 52.

Now a duplication light 53 having a spectrum which covers inhomogeneous broadening of the first medium 51 as shown in FIG. 8A is made incident upon the first medium 51. It should be noted that the duplication light 53 has a center wavelength which corresponds to the center wavelength of the first and second medium 52 and 52 and the spectrum shape of the duplication light is similar to the inhomogeneous broadening spectrum of the first and second medium. The duplication light 53 is absorbed in accordance with the light absorption spectrum of the first medium 51. In this case, at a hole in the light absorption spectrum, the absorption has been already saturated, so that the light having wavelength corresponding to the hole is transmitted through the first medium 51 without being absorbed. Therefore, a light 54 transmitted through the first medium 51 has frequency components corresponding to the holes in the absorption spectrum of the first medium as depicted in FIG. 8C. This light 54 is then made incident upon the second medium 52. In the second medium 52, holes are formed at wavelengths corresponding to the frequency components of the light 54 as shown in FIG. 8D. In this manner, the burning holes in the first medium 51 is duplicated in the second medium 52. It should be noted that the holes in the first medium 51 might be erased, but this is preferable according to the present invention as will be explained later.

In the embodiment shown in FIG. 13, the above mentioned duplication of the hole-burning spectrum is utilized. A transmitter 100 has the same construction as that of the first embodiment, so that it is illustrated only by a block. The receiver end has substantially same construction as that of a third embodiment to be explained later, but in the present embodiment, the absorption spectrum duplicated on the hole-burning effect element is read out by sweeping the frequency of a laser beam having a spectrum width which is substantially equal to or is narrower than the hole formed in the absorption spectrum.

Now, the present embodiment will be explained with reference to FIG. 13. The input serial data is transmitted from the transmitter 100 to the receiver end by the same manner as that of the first embodiment. That is to say, the single light pulse is transmitted to the receiver end by means of an optical transmission path 101. The thus transmitted light pulse is made incident upon a hole-burning effect element 104 by means of a lens 102 and is focused thereon. This light pulse is the light beam which has been transmitted through the transmitter end hole-burning effect element, so that it has peaks at frequencies corresponding to the transmitted data, i.e. at wavelengths at which the absorption in the hole-burning effect element is saturated. When the light beam having such a property is made incident upon the receiver end hole-burning effect element 104, the absorption is saturated at frequencies corresponding to the above mentioned peaks in the absorption spectrum, so that holes are formed on the absorption spectrum. The data duplicated on the receiver end hole-burning effect element can be read out as described below.

The laser 103 is a wavelength varying laser having a narrow spectrum width which is substantially equal to or narrower than a width of a hole recorded on the hole-burning effect element 104. The frequency of the laser 103 is swept by a frequency sweeping circuit 108 under the control of a controller 107 over the frequency range where the data is recorded on the hole-burning effect element 104. The laser beam from the laser 103 is made incident upon the hole-burning effect element 104 and the laser beam transmitted through the hole-burning effect element is made incident upon a photodetector 106 via a shutter 105. The shutter 105 is controlled by the controller 107 to be opened for a time period during which the frequency of the laser beam from laser 103 is swept by the frequency sweeping circuit 108, so that the laser beam transmitted through the hole-burning effect element 104 is made incident upon the photodetector 106. In this manner, the absorption spectrum of the hole-burning effect element 104 corresponding to the transmitted data is made incident upon the photodetector 106 in a serial manner. In the photodetector 106, the laser beam is converted into an electric signal representing the input serial data, and this electric signal is derived as a reproduced data signal.

The shutter 105 is closed when the light pulse transmitted from the transmitter 100 via the transmission path 101 is made incident upon the hole-burning effect element 104, so that any stray light can be prevented from being made incident upon the photodetector 106. Further, in case of transmitting serially a plurality of light pulses through the transmission path 101, each time a light pulse has been converted into an electric signal and prior to a reception of a next light pulse, an erasing or deleting light pulse is generated by the laser 103 and is projected on the hole-burning effect element 104 so that the duplicated data is erased. Also in this case, the shutter 105 is closed so that the erasing light pulse could not be made incident upon the hole-burning effect element 104.

In the above explained embodiment, the frequency sweep of the writing laser 1 and the opening and closing of the light shutter 3 are controlled in synchronism with the transmission rate of the input serial data to write or store the data into the hole-burning effect element 3. Therefore, even if the data is transmitted as the single light pulse in the multiplex mode, the transmission rate is limited by the input data transmission rate and could never exceed the input data transmission rate. That is to say, the input data could not be written in the hole-burning effect element 3 at a rate higher than the input data transmission rate, and thus there is a wasting time between successive light pulses transmitted through the optical fiber 8.

In another embodiment of the present invention shown in FIG. 4, the above explained wasting time on the light transmission path 8 can be avoided and the data transmission rate can be made higher than the data input rate. To this end, in this embodiment, as illustrated in FIG. 4, there are provided a plurality of transmission units, e.g. three transmission units 21, 22 and 23 for parallelly transmitting three independent serial data series a, b and c, and a light pulse series is transmitted in the multiplex mode over a common coupling optical system 24 and a single optical fiber 25.

The respective transmission units 21, 22 and 23 comprise narrow band writing lasers. 26, 27, 28; frequency sweep circuits 29, 30, 31 for sweeping the wavelengths of the writing lasers; light shutters 32, 33, 34 which are driven in accordance with the input serial data a, b, c; hole-burning effect element 35, 36, 37 for forming holes Corresponding to the input serial data in the frequency domain of the light absorption spectrum; wide band transmitting lasers 38, 39, 40; half mirrors 41, 42, 43 for introducing the laser lights emitted from the transmitting lasers 38, 39, 40 to the hole-burning effect elements; and reflection mirrors 44, 45, 46 for guiding the laser lights transmitted through the hole-burning effect elements into the coupling optical system 24. Each of the transmission units 21, 22 and 23 operates in the same manner as that of the first embodiment and the input serial data series a, b and c are transmitted parallelly in the multiplex mode.

In this embodiment, the operation timings of the frequency sweep circuits 29, 30 and 31 and wide band transmitting lasers 38, 39 and 40 of the transmission units 21, 22 and 23, respectively are controlled by a controller 47 such that the transmission light pulses emitted from the transmission units 21, 22 and 23 are multiplexed in a time division manner and the serial input data series a, b and c are transmitted parallelly along the single optical fiber 25.

As illustrated by timing charts of FIGS. 5A to 5J, for instance, in the transmission unit 21, the input serial data a is written on the frequency domain of the hole-burning effect element 35 by means of the frequency sweep signal for the writing laser 26 in synchronism with the input data a, and after the frequency sweep has been finished, a transmission light pulse is emitted from the wide band transmission laser 38.

In the transmission unit 22, the generation of the frequency sweep signal for the writing laser 27 and the generation of the transmission light pulse from the wide band transmission laser 39 are controlled such that the transmission light pulse is emitted in succession to the generation of the transmission light pulse from the transmission unit 21. Similarly, in the transmission unit 23, the generation of the frequency sweep signal for the writing laser 28 and the generation of the transmission light pulse from the wide band transmission laser 40 are controlled such that the transmission light pulse is emitted in succession to the generation of the transmission light pules from the transmission unit 22.

In this manner, the driving timings of the frequency sweep circuits 29, 30 and 31 and those of the wide band transmission lasers 38, 39 and 40 of the transmission units 21, 22 and 23 are controlled by the timing controller 47, so that during the data writing operation is carried out in the transmission unit 21, the transmission light pulses are emitted from the transmission units 22 and 23, successively. Therefore, a plurality of input serial data series a, b and c can be transmitted along the single optical transmission path, i.e. the optical fiber 25 in the time division mode, so that the transmission rate can be improved and the capacity of the transmitted data can be increased very largely.

In the embodiment shown in FIG. 4, there are provided three transmission units, but the number of the transmission units is not limited to three and a much larger number of transmission units may be arranged.

As explained above, according to the present invention, a plurality of data to be transmitted is formed on the frequency domain of the hole-burning effect element having the inhomogeneous broadening on the light absorption spectrum, and thus the data can be transmitted parallelly as the single transmission light pulse along the single optical fiber. Therefore, the data transmission capacity of the optical fiber can be increased materially.

Further, in the embodiment shown in FIG. 4, a plurality of transmission units are provided and the transmission light pulses are successively generated from these transmission units such that a plurality of serial data series are transmitted in the time division mode along the single optical fiber, and therefore the data transmission capacity can be further improved and the data transmission rate can be increased.

When the transmitter is composed of a plurality of transmission units, a plurality of receiver units each having the construction shown in FIGS. 2 and 13 may be provided in the receiver end. Each light pulse transmitted from a plurality of transmission unit is received by the receiver unit corresponding to the transmission unit, respectively and is converted into a plurality of serial data signals. In this manner, the transmission path can be utilized efficiently in a time division mode.

In the embodiments so far explained, in order to write the data in the hole-burning effect element, it is necessary to sweep the peak wavelength of the narrow band writing laser over a certain range. It is practically difficult to perform this frequency sweep at a high speed, so that an upper limit of the transmission rate might be limited by the sweep speed. Further at the receiver end, in order to divide the received light pulse into a plurality of lights having different wavelengths, it is required to provide the spectrometer having a high resolution. This results in that the system is liable to be large in size and expensive in cost.

Further, at the receiver end, the input serial data is converted into the parallel data. This serial-parallel data conversion is not always considered to be disadvantageous. However, in this case, the capacity of the data transmission line at the receiver end is usually set to be equal to the width of one word of the data to be processed by the computer, so that the degree of multiplex is limited to the word width, which is usually 32 bits and the efficiency of the multiplex data transmission could not be improved.

The present invention also provides the optical parallel transmission system in which the above explained demerits of the above mentioned embodiments can be removed by providing the hole-burning effect element not only in the transmitter end, but also in the receiver end. In such a transmission system, it is no more necessary to effect the wavelength sweep at the transmitter end and to provide the spectrometer in the receiver end, so that whole system can be small in size and less expensive in cost.

In such an optical parallel transmission system according to the invention, in addition to the above explained persistent hole-burning effect, photon echo effect is utilized. Before explaining embodiments utilizing the photon echo effect, the photon echo effect, and the relation between the photon echo effect and hole-burning effect will be explained.

The photon echo effect itself has been known and has been described in, for instance "Japanese Applied Physics" Vol 60, 1991, page 21; "OPTICAL LETTERS" Vol. 15, No. Feb. 1, 1990, pp. 195–197; and "OPTICAL LETTERS" Vol. 16, No. 4, Feb. 15, 1991, pp, 264–266. The photon echo effect also occurs when light is made incident upon a medium having an inhomogeneous broadening of the light absorption spectrum. In contrast to the hole-burning effect, the photon echo effect is generated by a light pulse.

As shown in FIG. 6A, laser light pulses $L_1$, $L_2$ and $L_3$ are made incident at time instants $t_1$, $t_2$ and $t_3$, respectively upon a medium having the photon echo effect, said laser light pulses having wavelengths which correspond to the absorption band of the medium and whose frequency band is broader than the homogeneous broadening of the hole-burning effect element. Then, induced photon echo I is generated at a time instant $t_2 + t_3 - t_1$. That is to say, when a time interval between the light pulses $L_1$ and $L_2$ is assumed as $\tau$, the induced light pulse I is emitted from the photon echo medium after the time interval $\tau$ from the light pulse $L_3$.

According to the invention, the second light pulse $L_2$ is modulated in accordance with the data to be transmitted as illustrated in FIG. 6B. That is to say, after the first light pulse $L_1$ is made incident upon the photon echo medium as the writing light pulse, serial data pulses are made incident upon the medium as the second light pulse. After a time period T has been passed from the first light pulse, the third light pulse $L_3$ is made incident upon the medium as the reading light pulse. Then, the serial data pulses are generated as the induced pulses I. In this case, if the medium is made of the same material as that of the PHB, the time period T becomes more than several hours. In the above mentioned publications, such a phenomenon is utilized to constitute a photon echo memory.

Next the relationship between the photon echo effect and the hole-burning effect will be explained. These effects are related to the medium having the inhomogeneous broadening in the light absorption spectrum and are mutually in the Fourier transformation. That is to say, the Fourier transformation of the time sequential signal read out of the photon echo memory from the time domain into the frequency domain is written in the hole-burning effect element as the change in the light absorption spectrum. This can be assumed from an experimentally confirmed fact that after a spectrum which has been obtained by Fourier transforming a certain pulse series has been written on the light absorption spectrum of the medium having the inhomogeneous broadening by using the CW (continuous wave) laser, when a reading light pulse is made incident upon the medium, the original pulse series is generated. However, prior to the present invention, no one has experimentally confirmed that when the light absorption spectrum of the medium having the inhomogeneous broadening is detected by the CW laser, a given Fourier transformation spectrum will be seen in the light absorption spectrum.

FIG. 9 is a block diagram showing an embodiment of the optical data transmitting apparatus according to the invention, and FIGS. 10A to 10G are signal waveforms for explaining the operation thereof. The apparatus comprises a transmission laser 61 and a transmitter end hole-burning effect element 62 upon which a laser light emitted by the transmission laser is made incident. A light beam transmitted through the transmitter end hole-burning effect element 62 is made incident upon an optical fiber 65 by means of light shutter 63 and coupling optical system 64. Input serial data $A_1$, $A_2$, $A_3$ . . . shown in FIG. 10A are supplied to a transmitter controller 64 via an input terminal 67. The controller 66 divides the input serial data into a number of packets each having a plurality of bits the number of which is smaller than a ratio of the inhomogeneous broadening width to the homogeneous broadening width of the transmitter end hole-burning effect element 62 and a packet data signal is supplied to a laser driving circuit 68. Then, the laser driving circuit 68 supplies a pulse signal corresponding to the packet data signal to the transmission laser 62. As illustrated in FIG. 10B, before and after the pulse signal $P_2$, writing pulse $P_1$ and transmission pulse $P_3$ and erasing pulse $P_4$, respectively are inserted. In this manner, a laser driving signal for one packet is formed by the pulses $P_1$ to $P_4$. The transmission laser 61 is driven by such a driving signal to emit a laser light whose intensity is modulated in accordance with the driving signal, and the thus emitted laser light is made incident upon the transmitter end hole-burning effect element 62. As has been explained in connection with the photon echo effect, data corresponding to the data signal is written in transmitter end hole-burning effect element 62 as the light absorption spectrum. The center wavelength of the transmission laser 61 corresponds to the center wavelength of the light absorption spectrum of the transmitter end hole-burning effect element 62 and the spectrum distribution of the transmission laser is similar to the light absorption spectrum of the transmitter end hole-burning effect element. It should be further noted that the transmitter end hole-burning effect element 62 must have physical conditions in addition to the inhomogeneous broadening on the light absorption spectrum.

After the data of one packet has been written in the transmitter end hole-burning effect element 62, the transmission pulse $P_3$ is supplied to the transmission laser 62 and a transmission light pulse emitted from the transmission laser is made incident upon the transmitter end hole-burning effect element 62. Then, a single light pulse $P_5$ is generated from the transmitter end hole-burning effect element 62 as shown in FIG. 10C, in said light pulse the data of one packet being written on the frequency domain. The thus generated light pulse $P_5$ is made incident upon an incident end of an optical fiber 65 by means of a coupling optical system 64.

The light pulse $P_5$ transmitted through the optical fiber 65 is emitted from an exit end of the optical fiber and is made incident upon a receiver end hole-burning effect element 70 via a coupling optical system 69. The receiver end hole-burning effect element 70 is made of the same material as that of the transmitter end hole-burning select element 62 and the holes of the light absorption spectrum formed in the transmitter end hole-burning effect element 62 is duplicated in the receiver end hole-burning effect element 70. In this case, in order to prevent the writing light pulse and data light pulses from being made incident upon the optical fiber 65, the light shutter 63 is arranged between the transmitter end hole-burning effect element 62 and the coupling optical system 64 and is controlled by the controller 66. That is to say, only for a time period during which the data is duplicated from the transmitter end hole-burning effect element 62 to the receiver end hole-burning effect element 70, the light shutter 63 is opened by a shutter open signal $P_6$ shown in FIG. 10D. In this manner, the data written in the transmitter end hole-burning effect element 62 is transmitted through the optical fiber 65 as the single light pulse $P_5$ and the light absorption spectrum is duplicated in the receiver end hole-burning effect element 70.

In order to read the duplicated data out of the receiver end hole-burning effect element 70, a reception laser 72 is driven under the control of a receiver end controller 71 which is synchronized with the transmitter end controller 66, and a reading light pulse $P_7$ shown in FIG. 10E is made incident upon the receiver end hole-burning effect element 70. When the receiver end hole-burning effect element 70 is irradiated with the reading light pulse $P_7$, a light shutter 73 is closed so that the reading light pulse is not made incident upon a photodetector 74. When the photon echo light pulse series is generated from the receiver end hole-burning effect element 70, a shutter open signal $P_8$ shown in FIG. 10F is supplied from the controller 71 to the light shutter 73 and the photon echo pulse series is made incident upon the photodetector 74. Then, the photodetector 74 generates a serial data pulse series of one packet $P_9$ shown in FIG. 10G which appears at an output terminal 75. By repeating the above mentioned operation for successive packets, the input serial data can be transmitted parallelly via the optical fiber 65.

In the present embodiment, after the transmission light pulse has been emitted by the transmission laser 61, the shutter 63 is closed and an erasing light pulse $P_4$ shown in FIG. 10B is made incident upon the transmitter end hole-burning effect element 62 to erase the data written therein. Similarly in order to erase the duplicated data in the receiver end hole-burning effect element 70, an erasing light pulse $P_{10}$ shown in FIG. 10E is made incident upon the receiver end hole-burning effect element.

FIG. 11 is a block diagram showing another embodiment of the optical data transmitting apparatus according to the invention. In the embodiment shown in FIG. 9, in the light pulse transmitted along the optical fiber, the input serial data pulse are compressed on the frequency domain, so that there is a time space in which the light pulse is not transmitted. Further the reproduced data pulse could not have the information density higher than that of the input data pulses, so that the information transmission rate is not improved. In the present embodiment, a plurality of transmitters and receivers shown in FIG. 9 are provided and are operated in the time division mode, so that the data can be transmitted without producing a wasting time on the optical fiber at an improved data transmission rate.

As illustrated in FIG. 11, at the transmitter end there are provided a plurality of transmission units 81-1 to 81-n and at the receiver end there are also provided the same number of reception units 82-1 to 82-n. Each of the transmission units 81-1 to 81-n comprises the transmission laser 62, transmitter end hole-burning effect element 62, light shutter 63 and controller 66, and similarly each of the reception units 82-1 to 82-n comprises the receiver end hole-burning effect element 70, controller 71, reception laser 72 and light shutter 73 shown in FIG. 9. The transmission units 81-1 to 81-n are optically coupled with an incident end of an optical fiber 84 by means of a transmitter end light switch and coupling optical system 83, and the reception units 82-1 to 82-n are optically coupled with an exit end of the optical fiber 84 via a receiver end light switch and coupling optical system 85. The transmission units 81-1 to 81-n and the transmitter end light switch and coupling optical system 83 are controlled by a transmitter end master controller 86, and similarly the reception units 82-1 to 82-n and receiver end light switch and coupling optical system 85 are controlled by a receiver end master controller 87 which is synchronism with the transmitter end master controller 86.

FIGS. 12A to 12G are timing charts for explaining the operation of the apparatus depicted in FIG. 11. FIGS. 12A to 12C show the input data series each of which is divided into packets, and these packets are shifted from each other. Therefore, from the transmission units 81-1 to 81-n there are produced light pulses successively, each of said light pulses being compressed on the frequency domain. These light pulses are successively made incident upon the optical fiber 84 via the light switch and coupling optical system 83. FIG. 12D shows these light pulses transmitted along the optical fiber 84.

The light pulses transmitted through the optical fiber 84 are divided by the light switch and coupling optical system 85 and are successively made incident upon the reception units 82-1 to 82-n. The thus duplicated data in the reception units 82-1 to 82-n are read out at given timings to derive the serial data signals shown in FIGS. 12E to 12G. The transmitter end master controller 86 and the receiver end master controller 87 are synchronized with each other, so that the transmission units 81-1 to 81-n, reception units 82-1 to 82-n, transmitter end light switch and coupling optical system 83, and receiver end light switch and coupling optical system 85 are controlled in accordance with a given sequence. In the present embodiment, a plurality of serial data signals A, B, C . . . N can be transmitted through the single optical fiber 84 in the time division mode, so that the data transmission rate can be improved. Such a data transmission system is similar to the packet communication system generally used in the computer network.

As explained above in detail, in the embodiments of the optical data transmitting apparatus according to the invention shown in FIGS. 9 and 11, the hole-burning effect elements are provided in both the transmitter and receiver and the data is formed on the frequency domain of the medium having the inhomogeneous broadening on the light absorption spectrum, and therefore the data can be transmitted parallelly along the single optical transmission path and the data transmission capacity of the optical transmission path can be increased very largely. Further, it is no more necessary to sweep the wavelength of the laser light, the transmission rate can be increased materially. Moreover, the receiver end does not require the spectrometer having the high resolution, the whole apparatus can be simpler and less expensive. Since the serial data is directly reproduced, the multiplex factor is not limited by the word width of the serial data and can be increased to a very large extent.

What is claimed is:

1. An apparatus for optically transmitting data comprising:

a hole-burning material having an inhomogeneous width and a homogeneous width in an optical absorption line for recording said data to be transmitted, the inhomogeneous width being greater than the homogeneous width;

a first light source having a frequency width narrower than the inhomogeneous width for projecting a first light beam on the hole-burning material;

control means for controlling a wavelength of the first light beam from the first light source in accordance with said data to be transmitted;

a second light source having a frequency width wider than the homogeneous width for projecting a second light beam on the hole-burning material to transmit said data with said second light beam in parallel; and optical means for guiding the second light beam from the second light source through the hole-burning material to a transmission path for parallel transmission of said data to be transmitted;

wherein the first light beam having a wavelength corresponding to said data to be transmitted is projected on the hole-burning material from the first light source, and then the second light beam from the second light source is projected on the hole-burning material for transmitting said data.

2. An apparatus according to claim 1, wherein the control means comprises:

frequency sweeping means for sweeping frequencies of the first light beam from the first light source; and an optical shutter located between the first light source and the hole-burning material for controlling projection of the first light beam from the first light source in accordance with said data to be transmitted.

3. An apparatus for optically transmitting data comprising:

(a) a plurality of transmission units, each of the transmission units comprising:

a hole-burning material having an inhomogeneous width and a homogeneous width in an optical absorption line for recording said data to be transmitted, the inhomogeneous width being greater than the homogeneous width;

a first light source having a frequency width narrower than the inhomogeneous width for projecting a first light beam on the hole-burning material;

control means for controlling a wavelength of the first light beam from the first light source in accordance with said data to be transmitted;

a second light source having a frequency width wider than the homogeneous width for projecting a second light bream on the hole-burning material; and optical means for guiding the second light bream from the second light source through the hole-burning material to a transmission path;

wherein the first light beam having a wavelength corresponding to said data to be transmitted is projected on the hole-burning material from the first light source, and then the second light bream from the second light source is projected on the hole-burning material for transmitting said data; and (b) means for controlling the plurality of transmission units such that the second light beams from the plurality of transmission units are guided to the transmission path in a time sequential manner.

4. An apparatus for optically transmitting and/or receiving data comprising:

a hole-burning material having an inhomogeneous width and a homogeneous width in an optical absorption line for recording said data to be transmitted, the inhomogeneous width being wider than the homogeneous width;

a first light source having a frequency width narrower than the inhomogeneous width for projecting a first light beam on the hole-burning material;

control means for controlling a wavelength of the first light beam from the first light source in accordance with said data to be transmitted;

a second light source having a frequency width broader than the homogeneous width for projecting a second light bream on the hole-burning material;

optical means for guiding the second light bream through the hole-burning material from the second light source to a transmission path, in which the first light beam having a wavelength corresponding to said data to be transmitted is projected on the hole-burning material from the first light source, and then the second light beam from the second light source is projected on the hole-burning material for transmitting said data;

light dispersing means for dispersing the second light bream through the transmission path; and photoelectric transfer means for receiving the second light bream from the light dispersing means and for transducing the second light bream into an electric signal.

5. An apparatus according to claim 4, wherein the control means comprises:

frequency sweeping means for sweeping frequencies of the first light beam from the first light source; and an optical shutter located between the first light source and the hole-burning material for controlling projection of the first light bream from the first light source in accordance with said data to be transmitted.

6. An apparatus for optically transmitting data comprising:

(a) a plurality of transmission units, each of the transmission units comprising:

a hole-burning material having an inhomogeneous width and a homogeneous width in an optical absorption line for recording said data to be transmitted, the inhomogeneous width being wider than the homogeneous width a first light source having a frequency width narrower than the inhomogeneous width for projecting a first light beam on the hole-burning material;

control means for controlling a wavelength of the first light bream from the first light source in accordance with said data to be transmitted;

a second light source having a frequency width broader than the homogeneous width for projecting a second light bream on the hole-burning material;

optical means for guiding the second light bream through the hole-burning material from the second light source to a transmission path, in which the first light beam having a wavelength corresponding to said data to be transmitted is projected on the hole-burning material from the first light source, and then the second light bream from the second light source is projected on the hole-burning material for transmitting said data;

light dispersing means for dispersing the second light beam through the transmission path; and photoelectric transfer means for receiving the second light bream from the light dispersing means and for transducing the second light beam into an electric signal; and (b) means for controlling the plurality of transmission units such that the second light beams from the plurality of transmission units are guided to the transmission path in a time sequential manner.

7. An apparatus for optically transmitting data comprising:

a hole-burning material having an inhomogeneous width and a homogeneous width in an optical absorption line for recording said data to be transmitted, the inhomogeneous width being broader than the homogeneous width;

a light source having a frequency width narrower than the inhomogeneous width for projecting light pulses on the hole-burning material;

control means for controlling the light source such that the light source sequentially radiates a recording pulse for beginning a recording of said data to be transmitted on the hole-burning material, a pulse corresponding to said data, and a transmitting pulse for transmitting said data in parallel; and optical means for guiding the light pulses through the hole-burning material from the light source to a transmission path.

8. An apparatus according to claim 7, wherein the optical means includes an optical shutter for transmitting light which has passed through the hole-burning material after the light source has emitted the transmitting pulse.

9. An apparatus according to claim 7, wherein the light source radiates a deleting pulse for deleting said data recorded on the hole-burning material after the light source has emitted the transmitting pulse.

10. An apparatus according to claim 9, wherein the optical means includes an optical shutter for blocking off light which has passed through the hole-burning material when the light source radiates the deleting pulse.

11. An apparatus for optically transmitting data comprising:

(a) a plurality of transmission units, each of the transmission units comprising:

a hole-burning material having an inhomogeneous width and a homogeneous width in an optical absorption line for recording said data to be transmitted, the inhomogeneous width being broader than the homogeneous width;

a light source having a frequency width narrower than the inhomogeneous width for projecting light pulses on the hole-burning material;

control means for controlling the light source such that the light source sequentially radiates a recording pulse for beginning a recording of said data to be transmitted on the hole-burning material, a pulse corresponding to said data, and a transmitting pulse for transmitting said data in parallel; and optical means for guiding the light pulses through the hole-burning material from the light source to a transmission path; and (b) means for controlling the plurality of transmitting units such that the light pulses from the plurality of transmission units are guided to the transmission path in a time sequential manner.

12. An apparatus for receiving data transmitted optically in parallel through a transmission path comprising:

a hole-burning material having an inhomogeneous width and a homogeneous width in an optical absorption line for recording said data transmitted in parallel through said transmission path, said inhomogeneous width being broader than said homogeneous width;

a light source having a frequency width broader than the inhomogeneous width for projecting light pulses on the hole-burning material;

photoelectric transfer means for receiving the light pulses through the hole-burning material from the light source and for transducing the light pulses from the hole-burning material to an electric signal; and optical means for guiding the light pulses from the hole-burning material to the photoelectric transfer means, wherein said data are transmitted to the hole-burning material in parallel through the transmission path, and then a reading pulse for reading said data is irradiated on the hole-burning material from the light source.

13. An apparatus according to claim 12, wherein the optical means includes an optical shutter for blocking off light which has passed through the hole-burning material when the reading pulse is radiated and for transmitting light which has passed through the hole-burning material when said data are read from the hole-burning material.

14. An apparatus according to claim 12, wherein the reading pulse is radiated from the light source for reading out said data from the hole-burning material, and then a deleting pulse is radiated for deleting said data recorded on the hole-burning material.

15. An apparatus according to claim 13, wherein the reading pulse is radiated from the light source for reading out said data from the hole-burning material, and then a deleting pulse is radiated for deleting said data recorded on the hole-burning material, the optical shutter blocking off the deleting pulse.

16. An apparatus for optically transmitting and/or receiving data comprising:

a first hole-burning material having a first inhomogeneous width and a first homogeneous width in an optical absorption line for recording said data to be transmitted, the first inhomogeneous width being broader than the first homogeneous width;

a first light source having a frequency width narrower than the first inhomogeneous width for projecting a light beam on the first hole-burning material;

control means for controlling the first light source such that the light source sequentially radiates a recording pulse for beginning a recording of the data to be transmitted on the hole-burning material, a pulse corresponding to said data, and a transmitting pulse for transmitting said data, said pulses being components of the light beam;

first optical means for guiding the light beam through the first hole-burning material from the first light source to a transmission path;

a second hole-burning material having a second inhomogeneous width and a second homogeneous width in the optical absorption line for recording said data transmitted through the transmission path, the second inhomogeneous width being broader than the second homogeneous width;

a second light source having a frequency width broader than the second homogeneous width for projecting reception light pulses on the second hole-burning material for reading said data;

photoelectric transfer means for receiving the reception light pulses through the second hole-burning material from the second light source and for transducing the reception light pulses to an electrical signal; and second optical means for guiding the reception light pulses from the second hole-burning material to the photoelectric transfer means, wherein said data are transmitted to the second hole-burning material by the transmitting pulse, and then the second light source radiates a reading pulse, which is one of said reception light pulses for reading said data.

17. An apparatus according to claim 16, wherein the first optical means includes an optical shutter for transmitting the light beam from the first hole-burning material when the first light source radiates the transmitting pulse.

18. An apparatus according to claim 16, wherein the first light source radiates a deleting pulse for deleting the data recorded on the first hole-burning material after radiating the transmitting pulse.

19. An apparatus according to claim 16, wherein the first light source radiates a deleting pulse for deleting the data recorded on the first hole-burning material after radiating the transmitting pulse and the first optical means includes an optical shutter for blocking off the light beam which has passed through the first hole-burning material when the first light source radiates the deleting pulse.

20. An apparatus for optically transmitting data comprising:

(a) a plurality of transmission units, each of said transmission units comprising:

a first hole-burning material having a first inhomogeneous width and a first homogeneous width in an optical absorption line for recording said data to be transmitted, the first inhomogeneous width being broader that the first homogeneous width;

a first light source having a frequency width narrower than the first inhomogeneous width for projecting a light beam on the first hole-burning material;

control means for controlling the first light source such that the light source sequentially radiates a recording pulse for beginning a recording of the data to be transmitted on the hole-burning material, a pulse corresponding to said data, and a transmitting pulse for transmitting said data, said pulses being components of the light beam; and first optical means for guiding the light beam through the first hole-burning material from the first light source to a transmission path;

(b) means for controlling the plurality of transmitting units such that the light pulses from the plurality of transmission units are guided to the transmission path in a time sequential manner; and (c) a receiving-unit comprising:

a second hole-burning material having a second inhomogeneous width and a second homogeneous width in the optical absorption line for recording said data transmitted through the transmission path, the second inhomogeneous width being broader than the second homogeneous width;

a second light source having a frequency width broader than the second homogeneous width for projecting reception light pulses on the second hole-burning material for reading said data:

photoelectric transfer means for receiving the reception light pulses through the second hole-burning material from the second light source and for transducing the reception light pulses to an electrical signal; and second optical means for guiding the reception light pulses from the second hole-burning material to the photoelectric transfer means, wherein said data are transmitted to the second hole-burning material by the transmitting pulse, and then the second light source radiates a reading pulse, which is one of said reception light pulses, for reading said data.

21. An apparatus for optically transmitting data comprising:

(a) a plurality of transmission units, each of said transmission units comprising:

a first hole-burning material having a first inhomogeneous width and a first homogeneous width in an optical absorption line for recording said data to be transmitted, the first inhomogeneous width being broader than the first homogeneous width;

a first light source having a frequency width narrower than the first inhomogeneous width for projecting a light beam on the first hole-burning material;

control means for controlling the first light source such that the light source sequentially radiates a recording pulse for recording the data to be transmitted on the hole-burning material, a pulse corresponding to said data, and a transmitting pulse for transmitting said data as components of the light beam;

first optical means for guiding the light beam through the first hole-burning material from the first light source to a transmission path;

(b) means for controlling the plurality of transmitting units such that the light pulses from the plurality of transmission units are guided to the transmission path in a time sequential manner;

(c) a plurality of reception units, each of said reception units comprising:

a second hole-burning material having a second inhomogeneous width and a second homogeneous width in the optical absorption line for recording said data transmitted through the transmission path, the second inhomogeneous width being broader than the second homogeneous width;

a second light source having a frequency width broader than the second homogeneous width for projecting reception light pulses on the second hole-burning material for reading said data;

photoelectric transfer means for receiving the reception light pulses through the second hole-burning material from the second light source and for transducing the reception light pulses to an electrical signal; and second optical means for guiding the reception light pulses from the second hole-burning material to the photoelectric transfer means, wherein said data are transmitted to the second hole-burning material by the transmitting pulse, and then the second light source radiates a reading pulse, which is one of said reception light pulses for reading said data; and (d) means for controlling the plurality of reception units such that the light pulses from the transmission path are guided to the plurality of receiving units in a time sequential manner.

22. An apparatus according to claim 16, wherein the second optical means includes an optical shutter for blocking off the light pulse when the transmitting pulse is radiated and for transmitting the light pulse when said data from the second hole-burning material are read out.

23. An apparatus according to claim 16, wherein the second light source radiates a deleting pulse as one of the reception light pulses for deleting said data recorded on the second hole-burning material after reading out said data from the second hole-burning material.

24. An apparatus according to claim 16, wherein the second light source radiates a deleting pulse as one of the reception light pulses for deleting said data recorded on the second hole-burning material after reading out said data from the second hole-burning material and the second optical means includes an optical shutter for blocking off the light pulse when the deleting pulse from reaching the photoelectric transfer means.

25. An apparatus for receiving data transmitted optically in parallel through a transmission path comprising:

a hole-burning material having an inhomogeneous width an a homogeneous width in an optical absorption line for recording said data transmitted in parallel through a transmission path, the inhomogeneous width being greater than the homogeneous width;

a light source having a frequency width narrower than the inhomogeneous width for projecting a light beam on the hole-burning material;

frequency sweeping means for sweeping frequencies of the light beam from the light source over a frequency region where said data are recorded; and photoelectric transfer means for receiving the light beam through the hole-burning material from the light source and for transducing the light beam into an electric signal.

26. An apparatus according to claim 3, wherein the second light beam is projected on the hole-burning material for encoding the data in parallel in the second light beam.

27. An apparatus according to claim 4, wherein the second light beam is projected on the hole-burning material for encoding the data in parallel in the second light beam.

28. An apparatus according to claim 6, wherein the second light beam is projected on the hole-burning material for encoding the data in parallel in the second light beam.

29. An apparatus according to claim 16, wherein the transmitting pulse is projected on the first hole-burning material for encoding the data in parallel in the transmitting pulse.

30. An apparatus according to claim 20, wherein the transmitting pulse is projected on the first hole-burning material for encoding the data in parallel in the transmitting pulse.

31. An apparatus according to claim 21, wherein the transmitting pulse is projected on the first hole-burning material for encoding the data in parallel in the transmitting pulse.

32. An apparatus according to claim 1, wherein the second light beam is projected on the hole-burning material to encode the data to be transmitted into the second light beam in parallel.

* * * * *